United States Patent

Miller

[15] 3,659,770

[45] May 2, 1972

[54] CIRCUIT BONDING MEANS

[72] Inventor: Charles Fredrick Miller, 843 South State College Boulevard, Anaheim, Calif. 92806

[22] Filed: Dec. 13, 1968

[21] Appl. No.: 783,571

[52] U.S. Cl. .................................228/1, 29/470.3, 29/626, 228/4, 228/8
[51] Int. Cl. .......................................B23k 1/06, B23k 5/20
[58] Field of Search ......................228/1, 4, 8; 29/626, 470.3

[56] References Cited

UNITED STATES PATENTS

| | | | |
|---|---|---|---|
| 2,308,606 | 1/1943 | Ingerson | 228/14 X |
| 3,083,595 | 4/1963 | Frank et al. | 228/8 X |
| 3,302,277 | 2/1967 | Pruden et al. | 228/9 X |
| 3,305,157 | 2/1967 | Pennings | 228/1 |
| 3,307,763 | 3/1967 | Rasimenoks et al. | 228/5 X |
| 3,314,582 | 4/1967 | Haigler | 228/1 |
| 3,342,395 | 9/1967 | Diepeveen | 228/1 |
| 3,357,090 | 12/1967 | Tiffany | 228/1 X |

*Primary Examiner*—Charlie T. Moon
*Assistant Examiner*—R. J. Craig
*Attorney*—Nienow & Frater

[57] ABSTRACT

This disclosure relates to improvements in methods and in means for accomplishing electrical wiring. The method makes use of a bonding tool which is capable of furnishing energy sufficient to bond a conductor to a circuit point. The conductor is positioned over that point in the line of action of the tool. Bonding energy is applied to complete the bond. The standing part of the conductor is grasped at a point along its length adjacent to but removed from the bond and it is pulled sufficiently to break the conductor adjacent the bond. Grasp of the conductor is maintained and its broken end is then positioned to lie in the line of action of the bonding tool so that the two can be moved together to another circuit point. Advantageously, these are made the end steps, those applicable to completion of a second bond, in a process which includes additional steps by which a first bond is completed. The means envisioned by the disclosure includes a bonding tool and a clamp mounted for movement with the bonding tool but capable of independent movement so that it can break the standing part of a length of conductor wire after completion of a circuit run and so that it can position the broken end properly to initiate another circuit run. In addition to the bonding tool and the clamp and the means to move them together, apparatus is disclosed by which the proper coordination between these several elements is assured.

8 Claims, 3 Drawing Figures

Patented May 2, 1972

3,659,770

INVENTOR.
CHARLES FREDRICK MILLER
BY
Nienow & Frater
ATTORNEYS

CIRCUIT BONDING MEANS

This invention relates to improvements in methods and means for accomplishing electrical wiring. The advent of micro-miniaturization in the production of electrical and electronic circuit components has given rise to a need for methods and for means by which to interconnect these components in a correspondingly small electrical circuit arrangement. The components are available in a variety of forms including disccete units and components defined by integrated layers of conductive and non-conductive and semi-conductive materials. The several components are interconnected to form the complete electrical circuit by wires extending from the terminals of one component to the terminals of another. The wires employed may have a cross-sectional area of 1 mil or less and the wire may be connected between circuit points some of which are only a few hundredths of an inch apart. To fabricate miniature circuits of this kind presents a number of problems. Thus neither wire, components or tools are adequately seen without magnification. Usually direct manual manipulation of the parts and wires is not possible. Coordinating the positioning of wires and the proper application of bonding energy is particularly difficult and it is an object of this invention to overcome that difficulty in substantial degree.

It is an object of the invention to provide an improved electrical wiring method by which the fabrication of miniaturized electronic circuitry is facilitated. The method is not limited to production miniaturized circuitry but it is particularly applicable to that purpose. Another object of the invention is to provide an apparatus which is particularly useful in practicing that method even though not limited thereto.

Bonding of the conductor wires to the circuit points may be accomplished by the application of sonic, thermal, compressive and other forms of energy or by a combination of these several forms. The invention is applicable regardless of which of these is used but it is especially meaningful in connection with those forms of energy and those methods of energy application which result in weakening of the conductor wire immediately adjacent the bond. Thus, the invention is particularly applicable to wiring methods and wiring apparatus which utilize sonic energy as the bond completing energy. An object of the invention is to provide a method and a means for accomplishing electrical circuit fabrication which is applicable to any of those commonly used conductor connection energy forms in which bonding of the conductor to the circuit point is accomplished. A particular object is to provide an improved method and means for accomplishing electrical circuit wiring utilizing sonic bonding tools through the medium of which sonic energy is utilized to accomplish a bond between the conductor and the circuit point to which it is to be connected.

Other objects of the invention are to provide improved methods and means for accomplishing electrical circuit connection inexpensively, in a way that produces bonds that are reliable both mechanically and electrically, consistently and relatively rapidly. In this connection, it is an object of the invention to provide a bonding device useful and practical as a production tool both for high volume production of a given product and in the production of prototypes and small quantities of custom products.

The method of the invention relates to the accomplishment of electrical wiring with the aid of a bonding tool. The product of the method is an electrical and mechanical connection between an electrical conductor and a circuit point. The bonding tool is one capable of furnishing energy at the position at which interconnection of the conductor and circuit point are to be accomplished and to furnish it in quantity sufficient to effect the bond. In the method, the conductor is positioned over the circuit point to which it is to be bonded so that it lies in the line of action of the bonding tool. Bonding energy is then applied by the tool to accomplish bonding of the conductor to the circuit point. The standing part of the conductor is then grasped at a point along its length adjacent to but removed from the bond. The conductor is then pulled sufficiently to break it adjacent the bond. Grasp of the conductor is maintained and the broken end of the conductor is then positioned to lie the line of action of the bonding tool and the bonding tool and the broken end of the conductor are moved together relative to the circuit point. By these steps the second bond is completed and the conductor is readied for certain initial steps, also contemplated within the invention, of a procedure in which one end of a conductor is bonded to a first circuit point, in which the conductor is run unbroken to a second circuit point, in which the conductor is bonded to the second circuit point, and in which the standing part of the conductor is broken at a point adjacent to the bond at the second circuit point. Thus the invention also contemplates the steps of grasping a length of conductor at a point near but removed from its end; holding that end of the conductor in the line of action of the bonding tool; and moving the conductor and tool together in a search procedure to a circuit point such that the conductor engages the circuit point and is forced against it by the tool. Bonding energy is then applied to the conductor in a quantity to accomplish bonding of the wire to the circuit point. Thereafter, the grasp of the conductor is relaxed and the length of conductor is paid out sufficient to reach the circuit point first mentioned above and the method is continued with the steps previously described.

In preferred form, the method of the invention is practiced using a length of conductor longer than required to complete the desired circuit run so that a supply of conductor material is provided and by moving that supply together with the tool relative to the circuit point to which bonding is to be effected. This step, when included in the method, is particularly advantageous. The initial bond of the circuit run having been made, it is necessary only to move the tool to a position in which its line of action includes the point at which the run is to be completed by a second bond and then an appropriate length of conductor will have been paid out in the process. Nonetheless, in certain applications of the method it will be desirable to pay out an additional length of conductor more than sufficient to reach between the two circuit points. In this circumstance the method includes the step of grasping the conductor at a point along its length removed from the line of action of the bonding tool and moving that point of the conductor in the direction toward the line of action of the bonding tool and thereafter releasing that point from the grasp. Thus conducted, this step insures that a proper relationship between the position of the conductor and the bonding tool is maintained despite the paying out of an additional length of conductor material.

Several advantages accrue if the method is practiced so that successive circuit runs are formed without reversing the direction in which runs are made from one run to the next. For example, if the method is being practiced manually at a work station in front of the practitioner where the circuit points are located, it will be advantageous to complete successive circuit runs uniformly in a direction away from the practitioner so that the first bond is always the one closest to him or in a direction toward one practitioner so that the second bond is always closest to him. When operation is done manually it will be most advantageous to make first that circuit connection which is closest to the practitioner and to make second that connection which is farthest from him. In the case of automatic operation with machinery, no one direction is preferred although, as in the case of manual operation, uniformity of direction is preferred. In the case of manual operation, this procedure simplifies the task by improving the visibility and in the case of automatic operation it greatly simplifies the machinery required to accomplish the method. In combinations of manual and automatic operation where some of the tasks are done automatically in response to manually directed steps, the result is a better quality result in shorter time with less expensive apparatus.

Figures 1, 2:
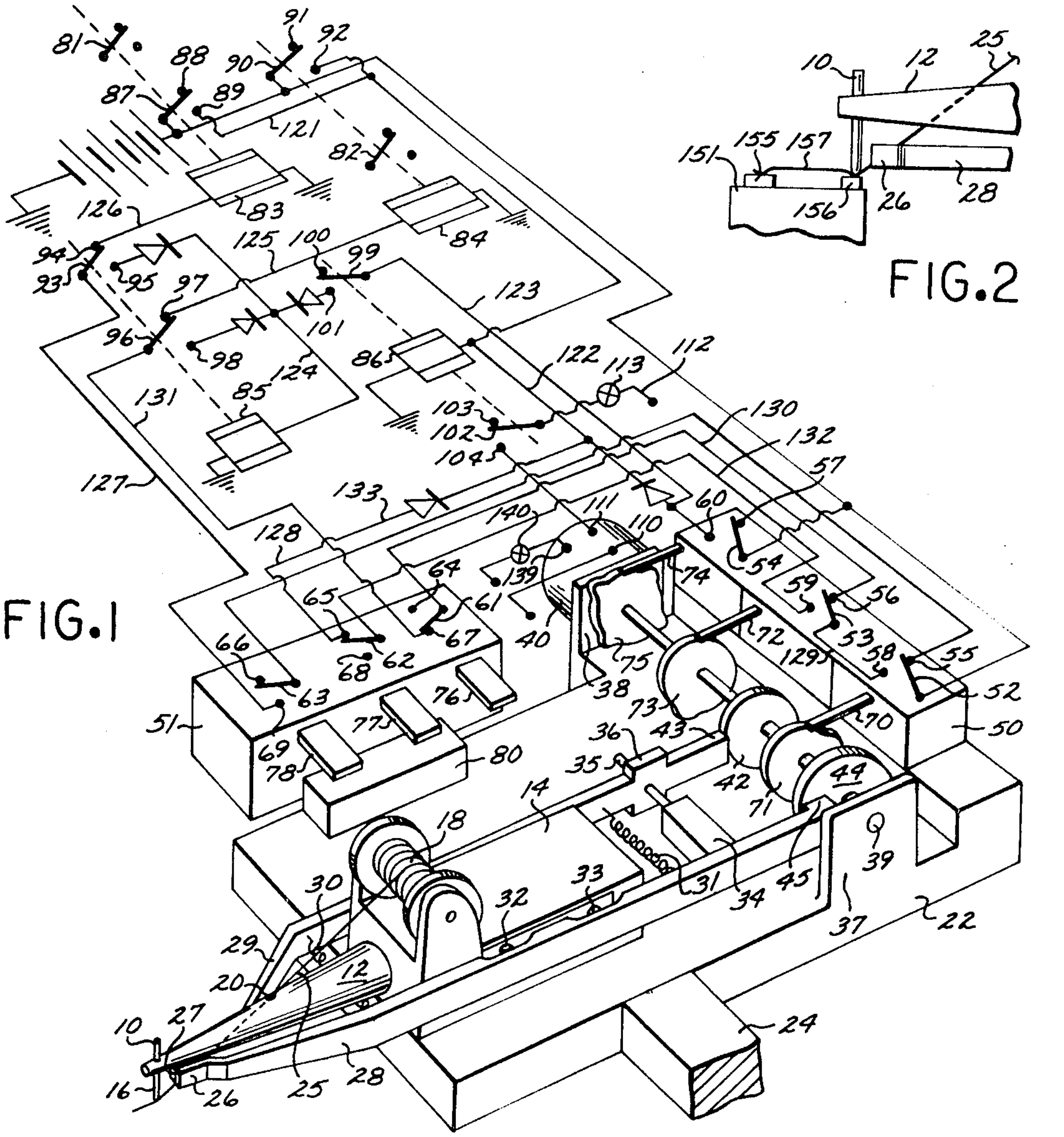
FIG. 1 is a schematic diagram of apparatus embodying the invention.
FIG. 2 is a view in side elevation of a fragment of the apparatus of FIG. 1 shown in relation to a workpiece.

A circuit wiring apparatus which is novel and useful independently of the method of the invention but which can be employed in practicing the method of the invention is illustrated in the drawings. Referring first to FIG. 1, and in particular to the lower left hand corner of FIG. 1, the numeral 10 designates a binding tool which in this embodiment comprises a rod extending downwardly through the outer, small end of a tapered sonic energy transmission member 12 whose rearward end extends within a housing 14 where the sonic energy is generated and applied to the transmission line 12. This energy has a form which causes the bonding tool 10 to vibrate and to impart sonic energy to objects upon which the lower end 16 of the tool is placed. Conductor wire is wound upon a spool 18 rotatably mounted upon the housing 14 so that the conductor may be paid out from the spool in a direction toward the lower end 16 of the bonding tool. The conductor wire passes through an opening 20 extending diagonally through the sonic transmission cone 12 to a point below the working end 16 of the bonding tool 10.

The housing 14 is carried upon a base plate 22 which is movable in three axes by structure represented by the arm 24 which extends from the base 22. This embodiment of the invention is intended for use with circuitry, the circuit points of which are arranged in a plane which is substantially parallel to the plane of the base 22. The bonding tool 10 is moved from one circuit point to another by movement of the base plate 22 in the direction of its length and width in the search procedure the object of which is to place the bonding tool 10 over the proposed bonding point in the direction of the thickness of plate 22, which advantageously is vertically over the proposed bonding point. The base plate 22 is held upwardly relative to the work so that the bonding tool is above and clears the circuitry during the search procedure. When the tool 10 has been located normal to and above the point at which a circuit connection is to be made, the positioning arm 24 is manipulated to lower the plate 22 in the direction of the circuit point. The wire 25, being positioned immediately below the lower end 16 of the working tool in its line of action, engages the circuit point first and is pressed down upon the circuit point by the lower end 16 of the bonding tool 10. Sonic energy is then applied to the bonding tool and the bond between the conductor wire and the circuit point is completed.

The apparatus shown in FIG. 1 is ordinarily arranged so that the operator using it would be at the left in FIG. 1 facing the tool 10 so that the tool faced the operator with the housing 14 behind. The apparatus includes a clamp positioned directly behind the lower end 16 of the bonding tool the clamp comprises two members one on each side of the wire. They are designated by the reference numerals 26 and 27. These clamping members are mounted upon arms which extend rearwardly one on each side of the housing 14. The arm at the operator's right, that arm which extends back from the clamp member 26, is designated by the reference numeral 28. Arm 29 is connected to the clamp member 27 and it extends rearwardly along the left side of the housing 14. The two clamp arms are urged together by a spring 30 which interconnects them in front of the housing 14. This spring tends to bring the clamp members 26 and 27 together to clamp upon the wire. The arms are held together at the rear of housing 14 by a spring 31 which is stronger than the spring 30 and whose action is such that the clamping members 26 and 27 are forced apart. This action results because the arms are mounted on a pivot roller that is arranged vertically. Two rollers are interposed between each of the arms and the side wall of the housing 14. Two of these rollers, designated by the reference numerals 32 and 33, are visible in FIG. 1. There is a corresponding pair of rollers on the other side between arm 29 and the opposite side of the housing 14. Arm 28 is capable of pivotal movement around the line of contact between the arm and the rearmost roller 33. The two arms 28 and 29 are interconnected so that they can move forwardly and rearwardly together by a rolling action over the roller pins 32 and 33. The interconnection is arranged so that the two arms must move together in the direction toward and away from the bonding tool 10, but so that pivotal movement of arm 28 about the roller 33 is permitted. This mechanical connection is represented schematically by the arm 34 which extends leftwardly from the arm 28 and which terminates in a pin 35 having sliding connection with arm 28, it extends through an opening in an enlarged portion 36 of the arm 29 in non-binding fashion.

Toward its rearward end the base plate 22 is provided with a bearing plate, one on each side of the base plate. The one on the left is designated by the reference numeral 37 and the one on the right is designated by the numeral 38. A shaft 39 is mounted between bearings in those plates respectively and is rotated by a drive motor 40 mounted upon the bearing plate 38. Five cams are mounted for rotation on the shaft 39. The middle one of these cams is designated by the reference numeral 42 and its function is to move the two arms 28 and 29 forwardly against the bias of a spring, not shown, which tends to urge the arms rearwardly so that the clamping members 26 and 27 are moved rearwardly away from the bonding tool 10. The rear face of arm 43 cooperates as a cam follower with a cam 42. The cam at the left is designated by the reference numeral 44 and it cooperates with the rightwardly extending end 45 of arm 28 to pivot arm 28 about the roller pin 33 against the bias of spring 31. It is the right face of cam 44 which is the cam surface that cooperates with the cam follower 45.

Thus, by the action of the cams 42 and 44 the clamp members 26 and 27 are brought together and urged apart and are moved toward and away from the bonding tool 10. These actions are in addition to joint movement of the clamp members and bonding tool in the $x$,$y$ and $z$ directions, relative to a work space below the bonding tool 10, and accomplished by manipulation of the base plate 22 through the structure represented by arm 24. While not immediately apparent because of the perspective nature of the drawing in FIG. 1, the rollers 32 and 33 are arranged so that the clamp members 26 and 27 move toward and away from the bonding tool 10 in a direction parallel to the conductor wire 25.

The remainder of the structure and the electrical circuitry depicted in FIG. 1 coordinates the position and clamping movements of the clamp members 26 and 27 with the position of the base plate, and consequently with the joint position of the bonding tool and clamp members, in the $x$, $y$ and $z$ axes. Two switch blocks are shown in FIG. 1. Each switch block comprises three single-pole double-throw switches. One block, at the rear of base plate 22 and connected thereto, is designated by the reference numeral 50. The other switch block is designated by the reference numeral 51. It is not carried on the base plate 22 and its position remains fixed relative to the work station on which is located the circuitry to be completed. Each switch in block 50 and block 51 is shown with its blade in the unactuated position. In switch block 50 the blades are designated by the reference numeral 52, 53 and 54, and are shown to be in contact with terminals 55, 56 and 57, respectively. Upon being tripped, the blades of these switches would contact terminals 58, 59 and 60, respectively. In switch block 51 the three blades are designated by the reference numerals 61, 62 and 63. They are shown in engagement with terminals 64, 65 and 66, respectively. Upon being tripped, these blades will engage terminals 67, 68 and 69, respectively. The actuating lever for blade 52 is designated by the numeral 70 and it cooperates with stop cam 71. The blade 53 is actuated by lever 72 which is operated by logic cam 73. Switch lever 74 actuates blade 54 in response to the camming action of logic cam 75. Blade 61 is actuated by lever 76, blade 62 is actuated by lever 77 and blade 63 is actuated by lever 78. The levers 76, 77 and 78 are moved into and out of blade actuating position depending upon whether or not they are engaged by the actuating block 80 which is carried by the base plate 22 and movable in the $x$, $y$ and $z$ directions with the bonding tool and clamp carried by the base. The block 80 is arranged so that if the base plate 22 is moved too far to the right or left, then the switches 61, 62 and 63 will not be actuated and the programmed events will not occur. Thus, in this embodiment, in practical effect, the function of the three switches 61, 62 and 63 is to detect whether the bonding tool and clamp have been moved upwardly away from the work or downwardly toward it and whether the bonding tool and clamp are moved toward the operator or have been moved to a point away from the operator. Actuation of the switches 61, 62 and 63 results in the application of energy to a series of relays in circuitry which includes the switches actuated by the cams 71, 73 and 75. By means of this circuitry, input motion to the base plate 22 is made to energize the motor 40 which rotates the cams 42 and 44 which, in turn, actuate the clamp members 26 and 27. Contacts of the series of relays energize and de-energize the sonic energy generating apparatus in housing 14. The interrelationship of these actions is depicted in FIG. 2.

FIG. 2 is a series of six curves having a common abscissa and individual ordinate scales. Distance along the abscissa represents degrees of cam shaft 39 rotation by the drive motor 40. In general, actuation of switch 63 results in energization of the motor 40 to rotate the cams from a zero position through an angle of 120°. Actuation of switch 61 results in rotation of the cam shaft from 120° to 240°. Actuation of switch 62 results in rotation from 240° back to the 360° or 0° position. The cam having been returned to the zero position, return of the switch 62 to unactuated position produces no further result. The motor will not rotate to turn the cam shaft from the 0° to 120° position until the switch 63 is actuated. Accordingly, the quiescent condition or starting condition of the structure is a condition in which the clamp is closed in a forward position; and in which the base plate 22, and accordingly the sonic bonding tool 10 and the clamp 26, are raised above the workpiece and sufficiently far forward so that the block 80 does not actuate the lever 76 of switch 61 but rather is in engagement with actuating levers 78 and 77 of switches 63 and 62. It will be apparent from the size of the block 80 that a substantial amount of movement of the base plate 22, and accordingly a substantial amount of movement of the bonding tool and clamp, are permitted in the directions from side to side and from front to back without disengaging the block 80 from the actuating levers 77 and 78. The operator is free to search within that area of movement to locate the bonding tool 10 exactly above the circuit position at which the first bond is to be made. Having found the correct position, the operator then lowers the bonding tool and clamp and the wire conductor end until the wire touches the circuit point and is pressed down thereon by the bonding tool 10. The work is positioned at an elevation so that when the bonding tool has reached the right position the block 80 will fall below the actuating level of actuating lever 78 and switch 63 will be actuated to complete the circuits through terminal 69 of the switch. That switch movement signals an action the effect of which is to energize the motor 40 to cause rotation of the cam shaft from the 0° to the 120° position. Referring to FIG. 2, actuation of the switch 63 initiates the bonding action. Bonding energy is applied to the sonic tool for a short period of time during which the conductor end is bonded to the circuit point. At the end of the bonding period the clamp opens and then moves rearwardly in slight degree so that it does not interfere with the paying out of conductor wire as the bonding tool is lifted and moved over the work piece in search of the second bonding point. The control circuitry is arranged so that the cam drive motor 40 will not be energized again until the switch 61 is actuated. It is actuated by lowering the bonding tool upon a circuit point rearwardly of the first point sufficiently so that the block 80 is effective to move the actuating lever 76 of switch 61. The conductor wire having been pair out during the search procedure will run under paid bonding tool in the line of its action. When the bonding tool is lowered it will rest upon the conductor wire which in turn will rest upon the circuit point to which it is to be bonded. When the tool is lowered, bonding energy is applied and the bond is completed.

In this particular embodiment, a dual channel sonic generator is employed, one being actuated by a closure of the switch 81 and the other by the closure of switch 82. These are relay operated switches actuated by relay coils 83 and 84, respectively. The bond being completed, the clamp closes and moves rearwardly from the neutral position pulling on the conductor wire and breaking it adjacent to the bond. The bond having been completed and the conductor wire broken, the operator lifts the bonding tool from the work. The two bonds having been completed, the lifting action is completed, as illustrated in that portion of FIG. 2 between the 240° and the 360° cam positions, to maintain the clamp tight upon the conductor wire and to move forwardly toward the bonding tool whereby the broken end of the conductor is thrust beneath the bonding tool in its line of action which is the position that it occupies at the 360° position and at the zero position at the beginning of the FIG. 2 diagrams.

The control circuitry also includes the contactors or switches whose actuating coils are designated by the numerals 83 and 84 and two additional contactors or switches whose actuating coils are designated 85 and 86. Coil 83 actuates two switches, one of which has already been described and is designated by the reference numeral 81. The other comprises a blade 87, an unconnected contact 88, and a contact 89 which is connected as hereinafter described. In addition to the switch 82, the coil 84 actuates a switch having a blade 90, an unconnected contact 91 and a contact 92 which is connected as described below. Coil 85 actuates two switchblades, one of which is designated 93 and shown in engagement with contact 94. This switch has another contact 95. Coil 85 also actuates switchblade 96 engaged with a contact 97 and engageable upon being actuated with a contact 98. Coil 86 also actuates two switches. The blade of one is designated 99 which is shown in engagement with an unconnected contact 100. The other contact is designated by the numeral 101. The other switch has a blade 102 shown in engagement with contact 103 and movable into engagement with a contact 104. All of these switches are shown to occupy the position they have when their respective energizing coils are unenergized.

Cam drive motor 40 is connected to a source of electric power connected to the terminals *x*. This circuit is traced from the source to a motor terminal 110, internally through the motor to the terminal 111 which is connected to contact 140 which is the normally open contact of switch 102. When the coil 86 is energized the blade 102 engages contact 104 completing the circuit by a conductor 112 to a switch 113 which, in this embodiment, is incorporated within the sonic energy generating apparatus and is effective to open the motor circuit for safety reasons while bonding energy is being applied to the bonding tool. The motor circuit is completed by a conductor from switch 113 to the source *x*. Thus coil 86 must be energized before the cam drive motor is energized. To insure that the cam is driven to the full 120° after the operator has closed switch 63 regardless of whether the switch 63 is opened prior to completion of the amount of rotation, an electrical interlock circuit is established by closure of cam actuated switch 54 shortly after cam rotation begins. This circuit, as shown in FIG. 2, remains closed throughout most of the cam rotation but it opens again just before the 120° position is reached. When switch 54 is actuated so that its blade contacts the normally open contact 60, a circuit is completed which maintains energization of the coil 86 whereby energization of the cam drive motor is continued even if the switch 63 is opened. Closure of switch 54 with its contact 60 also insures that energization of coil 85 is maintained through switch blade 99 which is engaged with contact 101. Energization of coil 85 actuates electrical interlock circuitry to maintain the relay 85 energized to prevent application of bonding energy to the bonding tool until the tool is placed in the position for making the second bond and the cam rotation has completed the desired clamping action and positioning. Referring to FIG. 2, cam 75 operates its switch to interrupt the electrical interlock to the cam drive motor at the end of each segment of its rotation. Cam 73 operates its switch to insure that the switch 62 which senses the vertical position of the bonding tool is not effective until the second bond is complete. Finally, cam 71 actuates its switch to insure that the forward and down position sensing switch is effective only during the time that the initial bond is to be made.

The electrical circuitry not previously described is traced as follows. Beginning at the upper portion of FIG. 1, energy for actuating the several relays is supplied by a direct current electric source labeled DC one side of which is grounded and the other side of which is connected by a conductor 120 to switchblade 87, switchblade 90, switchblade 54 and switchblade 52. The contact 89 is connected by a conductor 121 to the contact 92 to one side of the relay coil 86 whose other side is connected to the ground. The input side of the coil is also connected by a conductor 122 to contact switch 54. The latter is also connected by a line 123 to the switchblade 99, the normally open contact of which is connected by a line 124 to the relay coil 85 whose other side is connected to ground. Contacts 95 and 98 are connected by that same connector 124 to the relay coil 85. Contact 97 is connected by line 125 to one side of the relay coil 84 whose other side is connected to ground. Contact 94 is connected by line 126 to the relay coil 83 which is also connected to ground. Connector 127 connects switch 93 with terminal 69. Switchblade 63, which cooperates with that terminal 69, is connected by a line 128 to contact 55 of switch 52. Contact 58 of that switch is connected by a line 129 to the blade 53 of the adjacent switch. Contact 56 of that switch is connected by a line 130 to switch 61. Contact 64 of that switch is open but contact 67 is connected by a line 131 to switch 96. Terminal 59 is connected by line 132 to the switch 62 whose contact 68 is open and whose contact 65 is connected by a line 133 to the energizing coil 86.

The drive motor 40 is provided with an additional terminal 139 which is connected internally to the terminal 110 by a motor winding which, when energized, results in rotation of the motor in opposite direction. Switch 140, which is connected between the terminal 139 and the source of motor energizing power, symbolizes a means by which the motor can be reversed to drive the cams 42 and 44 backward through one or more cycles whereby the clamp can be made to grasp the conductor wire, thrust it forward and then release it and be retracted to again grasp the wire and again thrust it forward. By this action the wire can be paid out from the spool 18 to extend the length of wire if desired or to form a loop if the action is taken after the first bond has been completed.

Figure 3:
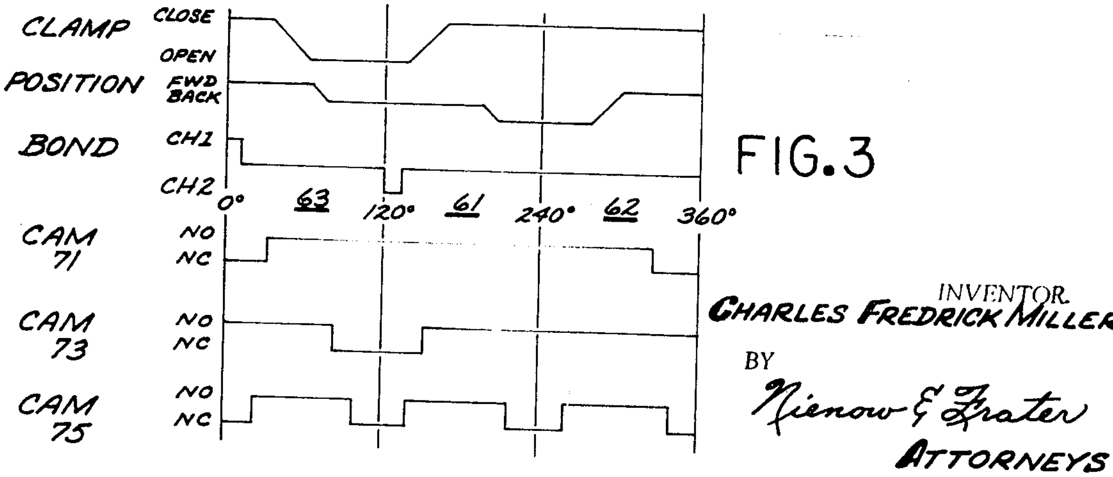
FIG. 3 is a chart illustrating operation of the several portions of the apparatus of FIG. 1 in timed sequence.

The product of the invention is shown in FIG. 3. The reference numeral 151 represents a work station upon which circuit points 155 and 156 are disposed. A conductor 157 has been bonded to the circuit point 155 and is shown being bonded to the circuit point 156 by the bonding tool 10 which rests upon the conductor and forces it against the circuit point 156. The clamp, side 26 of which is visible in FIG. 3, is clamped upon the standing part of the conductor wire. The supply length of wire is designated by the reference numeral 25. When the bond has been completed the clamp arms will retract the clamp pulling the standing part of the conductor wire in the direction in which it extends that is upwardly and to the right in FIG. 3, breaking the standing conductor adjacent the circuit point 156.

Although I have shown and described certain specific embodiments of my invention, I am fully aware that many modifications thereof are possible. My invention, therefore, is not to be restricted except insofar as is necessitated by the prior art and by the spirit of the appended claims.

I claim:

1. Apparatus for accomplishing bonding of electrical conductors to circuit points, comprising in combination:

a bonding means positionable relative to a work station for applying, to a conductor disposed at a circuit point at said work station and as an incident to predetermined positioning of the bonding means, energy sufficient to form a bond between the conductor and circuit point;

conductor control means responsive to said predetermined positioning and application of that energy, for pulling said conductor sufficiently to part it at a point adjacent the bond;

means for moving said bonding means up and down from one region relative to the work station laterally to a second region relative to the work station;

first position sensing means for sensing placement of the bonding means in a downward position in one region and providing a signal indicative of such placement;

second position sensing means for sensing placement of the bonding means in a downward position in said second region and providing a signal indicative of such placement; and upward position sensing means responsive to placement of the bonding means in an upward position for providing a signal indicative of such placement;

said bonding means being sensitive to said signals and effective to apply energy in response to provision of signals by said first position sensing means followed by provision of signals by said second position sensing means.

2. The invention defined in claim 1, in which said conductor control means is responsive to said signals and effective in response to provision of signals by said second position sensing means to grasp and to pull said conductor.

3. The invention defined in claim 2, in which said conductor control means is responsive to signals provided by said up position sensing means following provision of a signal by said second position sensing means to position and hold the parted end of said conductor in the line of action of said bonding means, and in which said means for moving said bonding means up and down is effective to move said bonding means and said conductor control means up and down in unison.

4. The invention defined in claim 3, in which said bonding means is sensitive to the provision of signals by said first position sensing means following the provision of signals by said up position sensing means for applying, to a conductor disposed on a circuit point at said work station, energy sufficient to form a bond between the conductor and the circuit point.

5. The invention defined in claim 4, in which said conductor control means is responsive, following application of bonding energy by said bonding means in response to the provision of signals by said first position sensing means following provision of signals by said up position sensing means, to release said conductor from its grasp.

6. Apparatus for accomplishing bonding of electrical conductors to circuit points, comprising in combination:

a bonding means positionable relative to a work station for applying, to a conductor disposed at a circuit point at said work station and as an incident to predetermined positioning of the bonding means, energy sufficient to form a bond between the conductor and circuit point;

conductor control means responsive to said predetermined positioning and application of that energy, for pulling said conductor sufficiently to part it at a point adjacent the bond;

means connected to said bonding means and movable therewith for holding a length of conductor material in the region of said bonding means and said conductor control means; and means selectively operable for grasping said conductor at a point along its length and moving it lengthwise toward said bonding means, releasing its grasp and regrasping said length of conductor at a point along its length more distant from the bonding means and again thrusting the conductor lengthwise in the direction of said bonding means.

7. The invention defined in claim 1, in which said first, second and upward position sensing means comprise a shaft, a motor connected to drive the shaft, switches associated with said first, second and upward position sensing means respectively and electric circuit means for energizing said motor to rotate the shaft in predetermined degree upon the actuation of said switches in selected sequence.

8. The invention defined in claim 7, in which said conductor control means comprises a pair of cams carried by said shaft and a clamp incorporating cam followers in cooperative relation with said cams and whose clamping action and position relative to said bonding means is determined by the position of said cams.

* * * * *